United States Patent [19]

Zalesak et al.

[11] 3,954,015

[45] May 4, 1976

[54] METHOD OF DETERMINING PIEZOELECTRIC CONSTANTS OF CERAMIC RINGS

[75] Inventors: Joseph F. Zalesak, Alexandria; Peter H. Rogers, Reston, both of Va.

[73] Assignee: The United States of America as represented by the Secretary of the Navy, Washington, D.C.

[22] Filed: July 17, 1975

[21] Appl. No.: 596,871

[52] U.S. Cl. .................................................. 73/552
[51] Int. Cl.² ........................................... G01M 7/00
[58] Field of Search ............ 73/552, 555, 556, 557, 73/558, 559, 560, 561; 324/56

[56] References Cited
UNITED STATES PATENTS 2,716,887    9/1955    Smith................................ 73/555 X
3,746,121   10/1970    Niklas................................ 73/560

Primary Examiner—Jerry W. Myracle
Attorney, Agent, or Firm—R. S. Sciascia; Arthur L. Branning; Melvin L. Crane

[57] ABSTRACT

A method of ascertaining the piezoelectric constants ($d_{31}$, $d_{33}$, $g_{31}$, and $g_{33}$) of ceramic cylindrical shells (rings) used as the active elements in hydrophones and sound sources to insure quality control. These constants may be obtained by measuring the electrical capacitance of the ring and by measuring the omnidirectional free-field voltage sensitivity, the ratio of the axial and radial sensitivity at a higher frequency and the physical dimensions of the ring. Since the required frequencies are low and the ring is symmetric, the acoustical measurements can be made in a closed mechanically driven air chamber.

2 Claims, 3 Drawing Figures

METHOD OF DETERMINING PIEZOELECTRIC CONSTANTS OF CERAMIC RINGS

BACKGROUND OF THE INVENTION

This invention is directed to measuring the characteristics of a piezoelectric element for use in a transducer and more particularly to the measurement of the piezoelectric constants ($d_{31}$, $d_{33}$, $g_{31}$, and $g_{33}$) of ceramic elements used as active elements in hydrophones and sound sources to insure quality control of the elements that made up the finished product.

The active elements of many sonar sources and hydrophones comprise one or more electrostrictive cylindrical shells. The performance of these transducers depends on the values of the piezo-electric coefficients ($g_{31}$, $g_{33}$, $d_{31}$, $d_{33}$). For a given piezo-ceramic material there is a wide variation in these constants from manufacturer to manufacturer and even from sample to sample from the same manufacturer. Currently available techniques for evaluating these coefficients either involve the use of specially prepared samples which do not have the shape of a cylindrical shell (i.e. bars, plates, disks, etc.), or involve resonance techniques which do not necessarily determine the individual piezoceramic coefficients but rather some linear combination of them in the form of an effective coupling coefficient.

It is well known tht the sensitivity of hydrophones using piezoceramic rings depends on both $g_{31}$ and $g_{33}$, as well as the various possible boundary conditions which may be placed on the ends of the ring.

The quantities $g_{31}$ and $g_{33}$ relate the electric field produced in the piezoelectric material to the applied stress. Here the 3 direction is the direction of polarization and the 1 direction is any direction perpendicular to the 3 direction. The first index indicates the electric field direction and then the second index referes to the direction of the applied stress. The quantities $d_{31}$ and $d_{33}$ relates the strain produced in a piezoelectric material to the applied electric field. Without previous knowledge of both $g_{31}$ and $g_{33}$ the sensitivity of a hydrophone could only be determined by calibration after the complete hydrophone has been assembled. When deployed in an array, precise control of individual element sensitivity is critical for minor lobe suppression. Hence, precise values for $g_{31}$ and $g_{33}$ are invaluable.

Often the effective coupling coefficient measured for an individual ring is not the one appropriate for the actual configuration in which the ring will be used in a transducer. For example, the effective coupling coefficient for a short, height-polarized ring measured at the first radial resonance yields essentially the $k_{31}$ coupling coefficient. However, if a stack of such rings were used as the driving element of a piston source, the appropriate coupling coefficient would be essentially $k_{33}$. Moreover, any mathematical model of a transducer which uses electrostrictive rings would require all piezoelectric coefficients to accurately predict all aspects of a transducer's performance.

A need, therefore, exists for a method by which $d_{31}$, $d_{33}$, $g_{31}$, and $g_{33}$ can be readily determined for a piezoceramic ring. Such a method has been set forth in a NRL Memorandum Report No. 2872 entitled *Proposed Method and Device for Obtaining Piezoelectric Constants of Ceramic Cylindrical Shells*, by J. F. Zalesak and P. H. Rogers, dated August 1974 and is incorporated herein as a reference.

DETAILED DESCRIPTION

Figure 1:
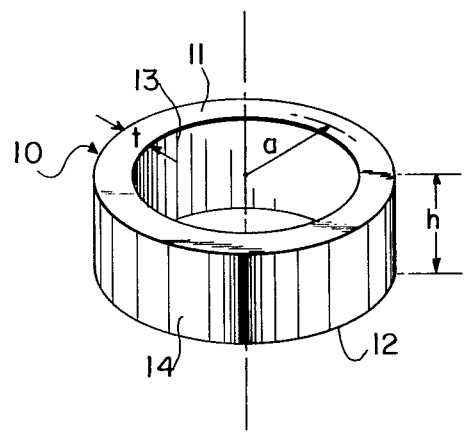
FIG. 1 illustrates a ceramic ring such as used in a transducer.

Now referring to the drawing, there is shown by illustration in FIG. 1, a ring type transducer element 10 having a thickness, $t$; a median radius, $a$; and a height, $h$. Piezoelectric rings may be used with electrodes on each end 11, 12 or on their inner 13 and outer surface 14. The piezoelectric constants ($d_{31}$, $d_{33}$, $g_{31}$, and $g_{33}$) may be different for the case in which the electrodes are placed on the ends 11, 12 and the ring is polarized and driven through its height, $h$, and the case in which electrodes are placed on the inner 13 and outer surface 14 and polarized and driven through its thickness.

In the case of a piezoceramic ring polarized and driven through its thickness, i.e., with electrodes on the inner and outer surfaces, it can be shown that the normal surface velocity distribution when the mean radial velocity is $u_a$ is given by $$u_i = (-1 - T/2\sigma')u_a$$
$$u_e = (H/2)u_a$$
$$u_o = (1 - T/2\sigma')u_a$$

where $\sigma' = -d_{31}/d_{33}$ is the effective Poisson's ratio; $u_i$ is the normal velocity of the inside surface of the ring, $u_e$ is the normal velocity of the end surface of the cylinderial ring, $u_o$ is the normal velocity of the outside surface of the ring, $u_a$ is the mean radial velocity, $T = t/a$, and $H = h/a$, where $t$ is the thickness of the ring, $a$ is the mean radius, and $h$ is the height of the ring.

The second case to consider is the case of a ring driven through its height, i.e., the ring is polarized and driven with electrodes on the top and bottom surfaces. For this case the normal surface velocity distribution when the mean radial velocity is $u_a$ is given by $$u_i = (-1 + T/2)u_a$$
$$u_e = (-H/2\sigma')u_a$$
$$u_o = (1 + T/2)u_a$$

where again $\sigma' = -d_{31}/d_{33}$.

Figure 2:
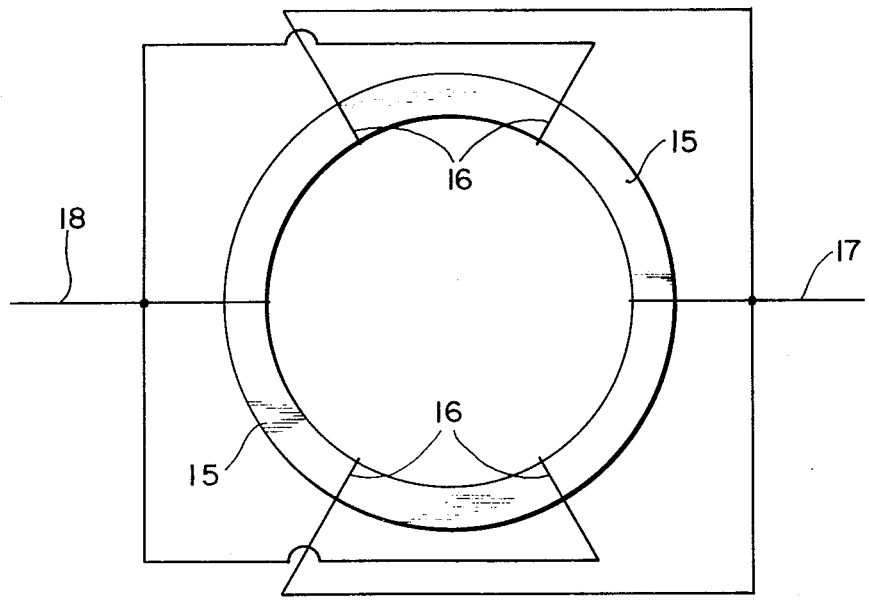
FIG. 2 illustrates a ceramic ring formed by six identical segments with electrodes on the joined segment ends.

FIG. 2 illustrates a ring formed of six equal segments 15 with an electrode 16 on the joined ends and separating adjacent segments. Alternating electrodes are connected three each to leads 17, 18 by which the ring may be circumferentially polarized and operated. In this case, the assembled ring is then polarized and driven with these electrodes, resulting in circumferential fields and hence circumferential drive. For this case, the normal surface velocity distribution when the mean radial velocity is $u_a$ is given by $$u_i = (-1 - T\sigma'/2)u_a$$
$$u_e = (-H\sigma'/2)u_a$$
$$u_o = (1 - T\sigma'/2)u_a$$

where again $\sigma' = -d_{31}/d_{33}$

At very low frequencies, these velocity distributions give rise to an omnidirectional radiation pattern. At such frequencies, the sensitivity of the ring is independent of frequency and proportional to ($g_{33} + 2g_{31}$). For the thickness polarized case, the free-field voltage sensitivity in dB re one volt per $\mu$Pa is $$M_H = 20 \log_{10} |aT(g_{33} + 2g_{31}) \times 10^{-6}|$$

where $a$ and $g$ are in MKS units. For the height polarized case, the result is $$M_H = 20 \log_{10} |aH(g_{33} + 2g_{31}) \times 10^{-6}|$$

and for the circumferentially polarized case, the result is $$M_H = 20 \log_{10} \left| \frac{2\pi aT}{N \ln[(1 + T/2)/(1 - T/2)]} (g_{33} + 2g_{31}) \times 10^{-6} \right|$$

where $M_H$ is the free-field voltage sensitivity, and $N$ is the number of segments in the ring.

As the frequency increases, the same velocity distribution produces structure in the directivity pattern. In this region, the ratio of the sensitivity in the axial direction to the sensitivity in the radial direction depends strongly on the ratio $\sigma' = -d_{31}/d_{33}$. Conversely, if one measures the ratio of the axial to radial sensitivity for a given ring, the ratio $d_{31}/d_{33}$ can readily be determined. The relationship between the ratio of the axial to radial sensitivity and the ratio of the d-constants can be determined from the following formuli:

$$S(f,\theta) = f[A + f^2(B + C \sin^2\theta)]$$

where $S$ is the directional response, $f$ is the frequency and $\theta$ the polar angle. The constants $A$, $B$, and $C$ are determined using the SHIP program (NRL Reports 7240 and 7749) and the appropriate velocity distribution. They are independent of frequency and polar angle but depend on geometry, polarization and $\sigma'$.

Figure 3:
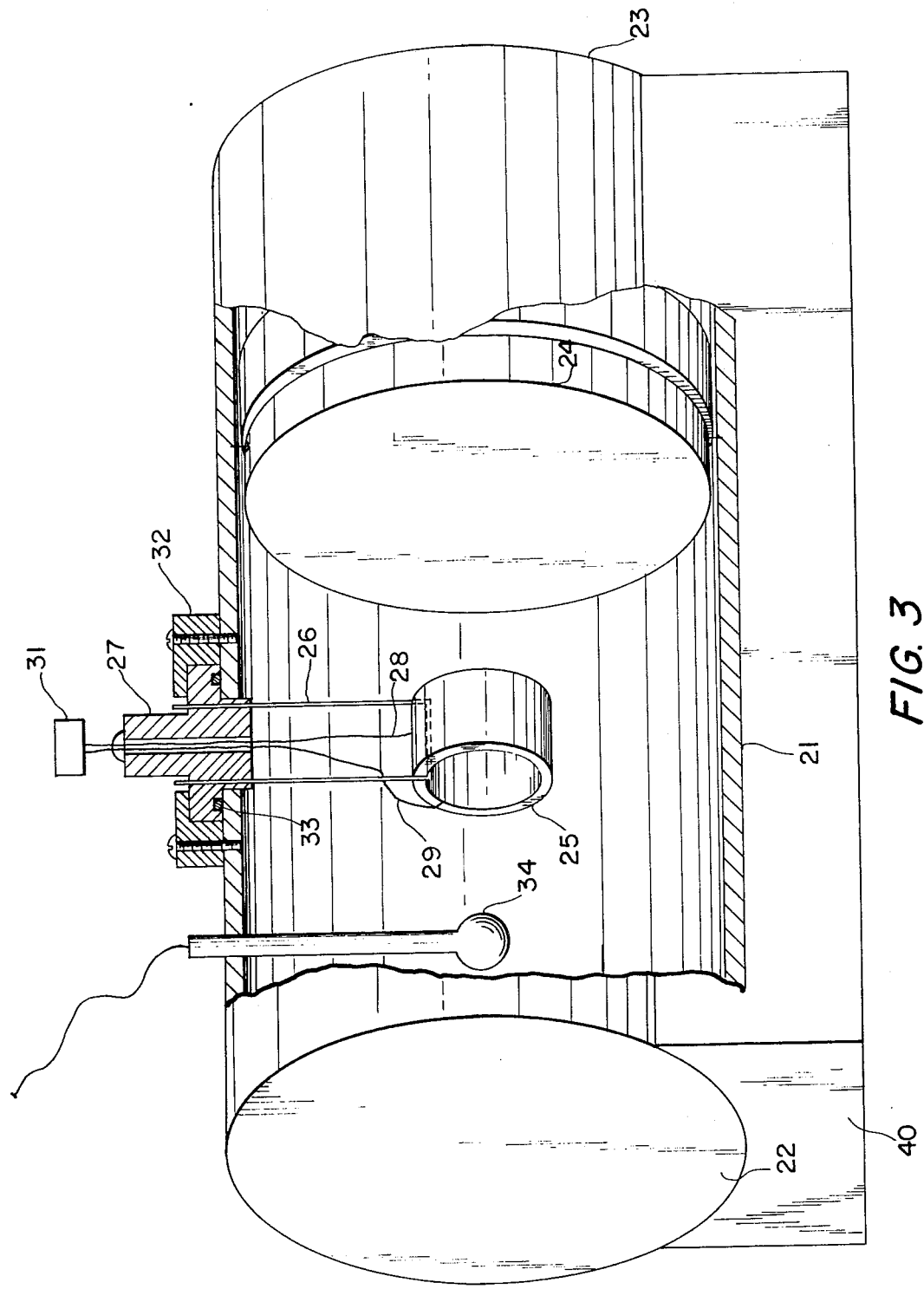
FIG. 3 illustrates a test chamber within which piezoelectric constants of a ring or tube may be determined.

Since $g_{33} = d_{33}/\epsilon_{33}^T$ and $g_{31} = d_{31}/\epsilon_{33}^T$ and $\epsilon_{33}^T$ is easily determined by measuring the electrical capacitance of the ring and the physical dimensions of the ring, one can thus obtain $g_{31}, g_{33}, d_{33}$ and $d_{31}$ by simply measuring the ring's omnidirectional sensitivity, and ratio of the axial and radial sensitivity at a higher frequency and the capacitance of the ring and the dimensions of the ring. Since the required frequencies are low and the ring is symmetric, the acoustical measurements can be made in a closed mechanically driven air chamber such as shown in FIG. 3. These measurements can be performed on unprepared bare samples as received from the manufacturer. Since only four electrical measurements are required and these can be made relatively rapidly, testing of individual rings could be performed on a production basis.

FIG. 3 illustrates a test or calibration chamber 21 for obtaining the sensitivity of samples under test. As shown, the chamber is a hollow metallic cylinder of steel or aluminum with a closed end 22 and an open end 23. The open end includes therein a piston 24 such as a pistonphone which produces the required plane standing wave or traveling wave within the chamber. In this particular configuration however, only standing waves are produced in the chamber. The chamber is filled with an appropriate nonelectrically-conducting acoustic medium such as air, silicone oil, or a fluorocarbon liquid, so that bare ceramic shells or other test samples may be tested. It is advantageous that the medium have a low sound speed so that the overall size of the test chamber may be as small as possible. The minimum cross section of the chamber is that cross section for which a negligible amount of sound energy is scattered by the ceramic shell 25 or test element under test compared with the total amount of energy of the wave within the calibration chamber. The test element is held in place by a line 26 supported by a rotatable plug 27 secured to the top of the chamber. The line is adjustable such that the test sample will be supported coaxially with the test chamber. Electrical conductors 28, 29 pass through the rotatable plug and are electrically attached to the appropriate electrodes of the test element 25 such as a ceramic shell and to a highly sensitive high impedance A.C. Voltmeter 31 on the outside of the chamber. The rotatable plug 27 is secured in place by a circular clamp 32 which is secured to the chamber wall. A suitable O-ring seal 33 is provided between the chamber and the rotatable plug to avoid leakage of fluid from within the chamber. A pressure monitoring hydrophone 34 may be provided for the purpose of measuring the inside acoustical pressure of the test chamber, if desired. The chamber rests upon a block 40 which conforms at its top to the contour of the chamber to prevent rotation thereof.

The calibration chamber is made such that it will support a one dimensional (i.e., plane) standing or traveling wave and is capable of generating sound pressure levels sufficient to produce a reasonable output from the test cylindrical shell. Due to the symmetry of the cylindrical shell, either a place standing wave or a traveling wave is suitable because the axial and radial sensitivities are completely independent of the direction of the wave. The test sample is located in the center of the chamber and positioned in two different orientations for measuring the response of the same. In one orientation, the sample is held with its axis aligned with the axis of the chamber which is perpendicular to the piston. The test sample is then rotated 90° so that its axis is perpendicular to the axis of the chamber and also parallel with the piston. The sensitivity is recorded in either position for the measurement of the very low frequency response and in both orientations at an intermediate frequency to obtain the desired sensitivity values at the different frequencies and orientations.

The other values necessary to determine the d- and g constants are the capacitance of the test sample and the physical measurements of thickness, $t$; median radius, $a$; and the height, $h$, of the test sample. These values are used as previously indicated to obtain the desired values.

The calibration chamber is not limited to the use of a pistonphone since any other piston device that can produce relatively high acoustic pressures up to frequencies in the range of 200 Hz may be used. At low frequencies, the acoustic pressure can be determined from known physical parameters. In order to determine the quantity $(g_{33} + 2g_{31})$, it is necessary to know the acoustic pressure within the calibration chamber at low frequencies. It is not however necessary to theoretically obtain this quantity; it may, rather, be measured directly with a standard calibrated hydrophone 34 or microphone within the chamber. Alternative acoustic driving mechanisms such as a moving coil loudspeaker, or a piston driven by piezoelectric elements may also be used. As previously indicated, it is necessary to go to higher frequencies, where the cylindrical shell exhibits directivity, in order to determine the radio $\sigma' = -d_{31}/d_{33}$. It is not, however, in this case, necessary to know the absolute pressure within the calibration chamber, all that is needed is the ratio of the voltages generated by the cylindrical shell for sound incident in the axial and radial direction. Measurements may be made at several frequencies to obtain an average value for the ratio $\sigma' = -d_{31}/d_{33}$.

This method enables the individual piezoelectric constants ($d_{31}, d_{33}, g_{31}, g_{33}$) to be determined for a sample in the form of a cylindrical shell or tube. These measurements can be performed on unprepared bare samples as received from the manufacturer. Since only four electrical measurements are required and these can be made relatively rapidly, testing of individual rings can be performed on a production basis This will enable appropriately matched ceramic tubes to be selected for assembly into electroacoustic transducers of current interest. Knowledge of these piezoelectric constants is also necessary in order to construct accurate mathematical models which describe the performance of electro-acoustic transducers.

Obviously many modifications and variations of the present invention are possible in light of the above teachings. It is therefore to be understood that within the scope of the appended claims the invention may be practiced otherwise than as specifically described.

What is claimed and desired to be secured by Letters Patent of the United States is:

1. The method of determining piezoelectric constants of cylindrical piezoceramic rings which comprises:

measuring the electrical capacitance of the rings;

measuring the omnidirectional sensitivity at a low frequency;

measuring the ratio of the axial and radial sensitivity of the ring at a higher frequency than said low frequency;

measuring the thickness, height and median radius of said ring, and inserting the above determined values into a known formula by which said piezoelectric constants are determined.

2. A method as claimed in claim 1 wherein:

said axial and radial sensitivities are measured within a calibration chamber by use of an acoustical piston capable of generating sound pressure levels sufficient to produce an output from said piezoceramic ring positioned within said chamber.

* * * * *